US009262124B2

(12) United States Patent
Mello et al.

(10) Patent No.: US 9,262,124 B2
(45) Date of Patent: Feb. 16, 2016

(54) NATURAL DISASTER FORECASTING

(75) Inventors: Ulisses Thibes Mello, Sao Paulo (BR); Lucas Villa Real, Sao Paulo (BR)

(73) Assignee: International Business Machines Corporation, Armonk, NY (US)

(*) Notice: Subject to any disclaimer, the term of this patent is extended or adjusted under 35 U.S.C. 154(b) by 1001 days.

(21) Appl. No.: 13/301,062

(22) Filed: Nov. 21, 2011

(65) Prior Publication Data

US 2013/0132045 A1 May 23, 2013

(51) Int. Cl.
| | |
|---|---|
| *G06G 7/60* | (2006.01) |
| *G06F 7/60* | (2006.01) |
| *G06F 17/50* | (2006.01) |
| *G06Q 10/06* | (2012.01) |
| *G06Q 50/26* | (2012.01) |

(52) U.S. Cl.
CPC .............. *G06F 7/60* (2013.01); *G06F 17/5009* (2013.01); *G06Q 10/0635* (2013.01); *G06Q 50/265* (2013.01)

(58) Field of Classification Search
CPC .............. G06F 3/0482; G06F 17/5009; G06F 17/30598; G06Q 10/087; G01W 1/10; G01W 1/00; G01W 1/02; G01W 1/08; G01W 1/04; G01W 1/06; G01W 1/16; G01W 1/14; G01W 1/17
USPC ............................................. 703/2, 6; 702/3
See application file for complete search history.

(56) References Cited

U.S. PATENT DOCUMENTS

| | | |
|---|---|---|
| 5,342,144 A | 8/1994 | McCarthy |
| 5,406,481 A | 4/1995 | Shinozawa et al. |

(Continued)

FOREIGN PATENT DOCUMENTS

| | | |
|---|---|---|
| JP | 2002298063A2 A2 | 10/2002 |
| JP | 2004164591 A2 | 6/2004 |
| KR | 20030043115 A | 6/2003 |

OTHER PUBLICATIONS

Yang Hong, Robert F. Adler, Predicting global landslide spatiotemporal distribution: Integrating landslide susceptibility zoning techniques and real-time satellite rainfall estimates, International Journal of Sediment Research, vol. 23, Issue 3, Sep. 2008, pp. 249-257.*

(Continued)

*Primary Examiner* — Kamini S Shah
*Assistant Examiner* — Russ Guill
(74) *Attorney, Agent, or Firm* — Ryan, Mason & Lewis, LLP

(57) ABSTRACT

A method, an apparatus and an article of manufacture for estimating risk of impact of a natural disaster on a populated area. The method includes using dynamic natural disaster modeling information to estimate a spatio-temporal distribution of a parameter of a potential natural disaster, wherein the modeling information is input to an instance of a weather forecast model which computes simulation results for natural disaster parameters for an area at a given time interval and the results produced on each time step within the time interval the estimate of the spatio-temporal distribution, and using static demographic data to estimate risk of impact of the parameter of the natural disaster on a populated area based on the estimated spatio-temporal distribution, wherein the demographic data is overlayed with the estimated spatio-temporal distribution via applying a weight to each populated area based on historical natural disaster incidents and related impact for each area.

17 Claims, 3 Drawing Sheets

(56) References Cited

U.S. PATENT DOCUMENTS

| | | | |
|---|---|---|---|
| 5,608,171 | A | 3/1997 | Hunter et al. |
| 5,717,589 | A | 2/1998 | Thompson et al. |
| 5,835,386 | A | 11/1998 | Orr et al. |
| 5,850,619 | A | 12/1998 | Rasmussen et al. |
| 5,959,567 | A | 9/1999 | Wolfson et al. |
| 6,018,699 | A | 1/2000 | Baron, Sr. et al. |
| 6,581,009 | B1 | 6/2003 | Smith |
| 6,947,842 | B2 | 9/2005 | Smith |
| 7,181,346 | B1 * | 2/2007 | Kleist et al. .......... 702/3 |
| 7,191,064 | B1 * | 3/2007 | Myers et al. .......... 702/3 |
| 7,280,920 | B1 * | 10/2007 | Whiteside et al. ......... 702/15 |
| 7,395,157 | B2 * | 7/2008 | Feyen et al. .......... 702/2 |
| 8,280,633 | B1 * | 10/2012 | Eldering et al. .......... 702/3 |
| 8,655,595 | B1 * | 2/2014 | Green et al. .......... 702/5 |
| 2003/0097230 | A1 | 5/2003 | Garabedian |
| 2007/0168155 | A1 * | 7/2007 | Ravela et al. .......... 702/179 |
| 2007/0214023 | A1 * | 9/2007 | Mathai et al. .......... 705/4 |
| 2007/0225915 | A1 * | 9/2007 | Weinzapfel et al. .......... 702/3 |
| 2007/0239496 | A1 * | 10/2007 | Supatgiat et al. .......... 705/7 |
| 2008/0021659 | A1 * | 1/2008 | Bertogg et al. .......... 702/15 |
| 2012/0047187 | A1 * | 2/2012 | Daus .......... 707/805 |

OTHER PUBLICATIONS

Lorenzo Alfieri et al., "Operational early warning systems for water-related hazards in Europe," Apr. 2012, Environmental Science & Policy, vol. 21, pp. 35-49.*

Ezio Todini, "An operational decision support system for flood risk mapping, forecasting and management," 1999, Urban Water, vol. 1, pp. 131-143.*

Ezio Todini, "Real-time flood forecasting: problems, possibilities and proposed solutions," 2003, in j. Zachau et al. (eds.), "Early Warning Systems for Natural Disaster Reduction," Springer-Verlag, pp. 215-239.*

John W. Zillman, "Meteorlogoical and hydrological early warning systems," 2003, in j. Zachau et al. (eds.), "Early Warning Systems for Natural Disaster Reduction," Springer-Verlag, pp. 135-164.*

Gabriel Arduino et al., "Recent advances in flood forecasting and flood risk assessment," 2005, Hydrology and Earth System Sciences, vol. 9, issue 4, pp. 280-284.*

Michael Bruen, "Teleflood: forecasting floods in urban areas downstream of steep catchments," 2006, in "RiverBasin Modeling for Flood Risk Mitigation," edited by Donald Knight et al., pp. 249-265.*

Rahman Khatibi et al., "Integration and goal-orientation in flood forecasting and warning," 2006, in "RiverBasin Modeling for Flood Risk Mitigation," edited by Donald Knight et al., pp. 587-601.*

H.L. Cloke et al., "Ensemble flood forecasting: a review," 2009, Journal of Hydrology, vol. 375, pp. 613-626.*

E. Todini, "FLOODSS: A flood operational decision support system," 2004, in "Natural Disasters and Sustainable Development," edited by R. Casale et al., Springer Verlag, pp. 53-64.*

* cited by examiner

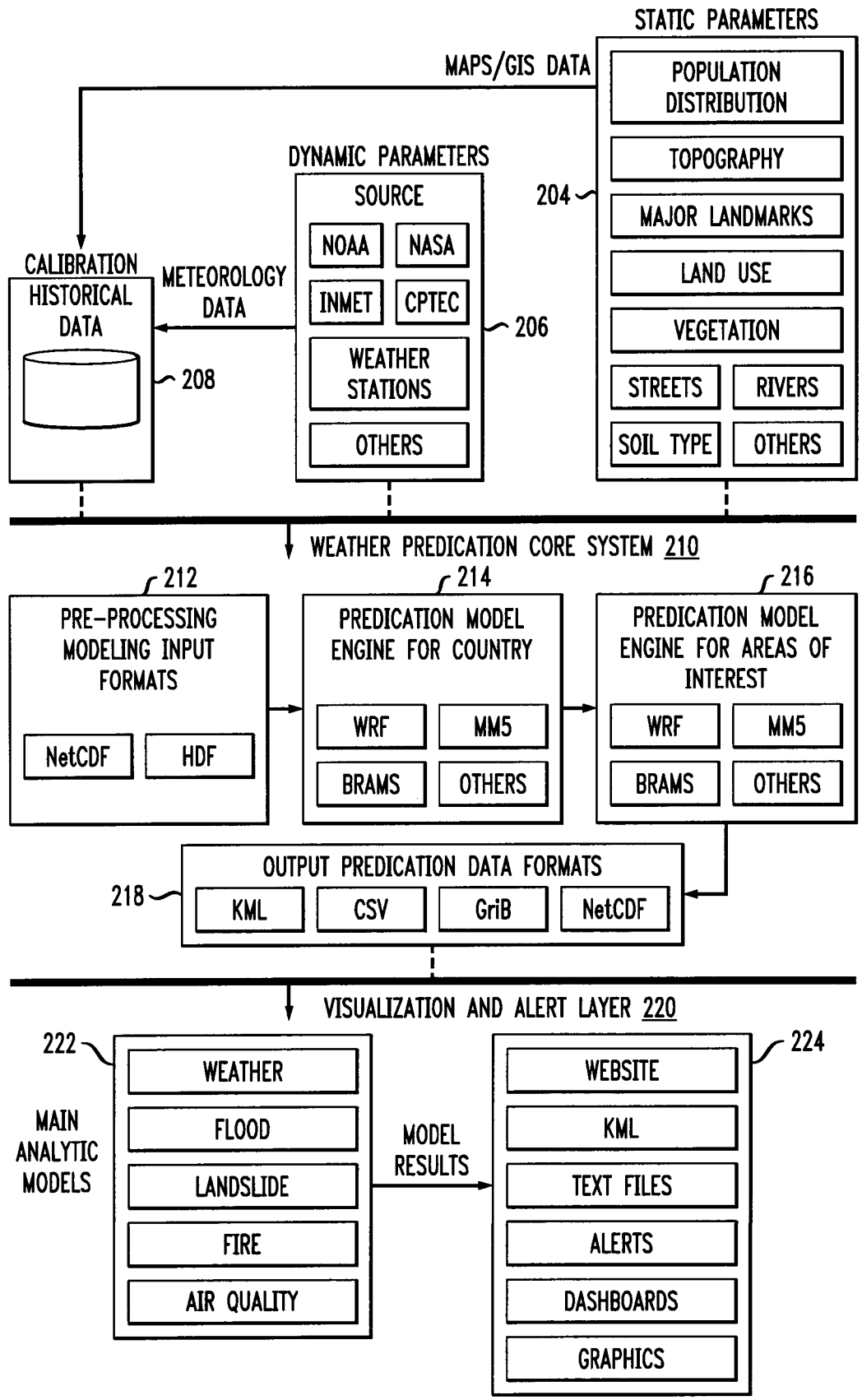

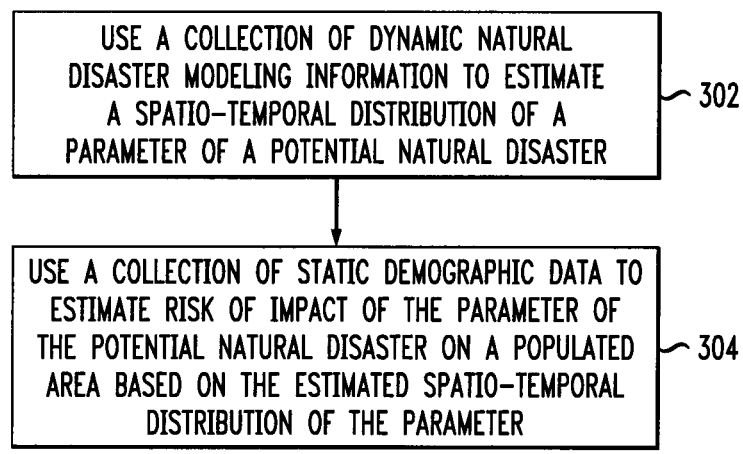
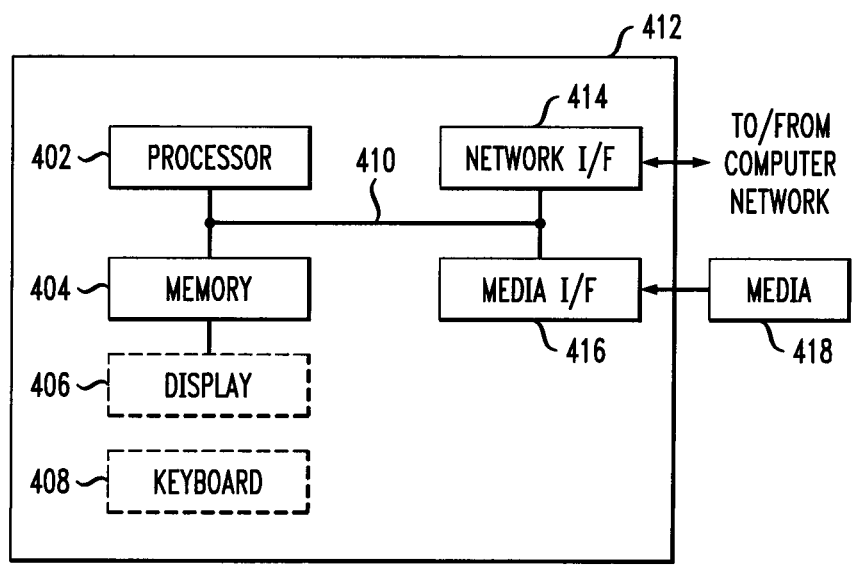

NATURAL DISASTER FORECASTING

FIELD OF THE INVENTION

Embodiments of the invention generally relate to information technology, and, more particularly, to natural disaster forecasting.

BACKGROUND OF THE INVENTION

Predictive analytics can be powerful tools for natural disaster management. Natural disasters are difficult to forecast because of the complexity of the physical phenomena and variability of the parameters involved. Existing natural disaster forecasting approaches do not take into account the uncertainty of the physical models or the uncertainty of the physical parameters. Accordingly, there exists a need for management of natural disasters which takes into account the uncertainty of parameters and models.

SUMMARY OF THE INVENTION

In one aspect of the present invention, techniques for natural disaster forecasting are provided. An exemplary computer-implemented method for estimating risk of impact of a natural disaster on a populated area can include steps of using a collection of dynamic natural disaster modeling information to estimate a spatio-temporal distribution of a parameter of a potential natural disaster, wherein the dynamic natural disaster modeling information is input to an instance of a weather forecast model which computes simulation results for multiple natural disaster parameters for an area at a given time interval and the simulation results produced on each time step within the given time interval are included as the estimate of the spatio-temporal distribution of a parameter of the potential natural disaster, and using a collection of static demographic data to estimate risk of impact of the parameter of the potential natural disaster on a populated area based on the estimated spatio-temporal distribution of the parameter, wherein the static demographic data is overlayed with the estimated spatio-temporal distribution via applying a weight to each of at least one populated area based on at least one historical natural disaster incidents and related impact for each area.

Another aspect of the invention or elements thereof can be implemented in the form of an article of manufacture tangibly embodying computer readable instructions which, when implemented, cause a computer to carry out a plurality of method steps, as described herein. Furthermore, another aspect of the invention or elements thereof can be implemented in the form of an apparatus including a memory and at least one processor that is coupled to the memory and operative to perform noted method steps.

Yet further, another aspect of the invention or elements thereof can be implemented in the form of means for carrying out the method steps described herein, or elements thereof; the means can include (i) hardware module(s), (ii) software module(s), or (iii) a combination of hardware and software modules; any of (i)-(iii) implement the specific techniques set forth herein, and the software modules are stored in a tangible computer-readable storage medium (or multiple such media).

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 2 is a block diagram illustrating an example embodiment, according to an aspect of the invention;

FIG. 3 is a flow diagram illustrating techniques for estimating risk of impact of a natural disaster on a populated area, according to an embodiment of the invention; and FIG. 4 is a system diagram of an exemplary computer system on which at least one embodiment of the invention can be implemented.

DETAILED DESCRIPTION OF EMBODIMENTS

Figure 1:
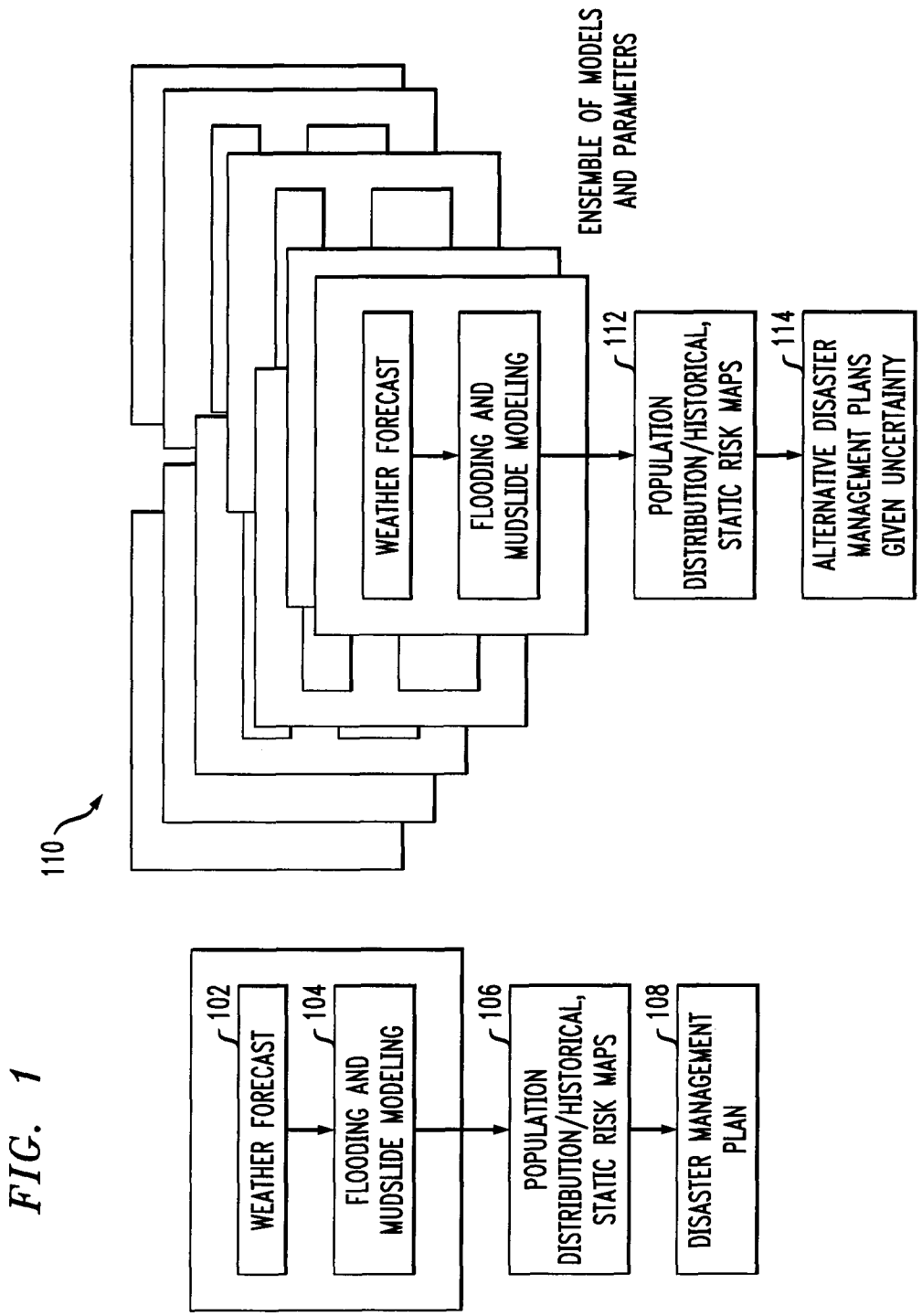
FIG. 1 is a diagram illustrating determinist modeling and stochastic modeling, according to an embodiment of the present invention.

As described herein, an aspect of the present invention includes forecasting and emergency management of natural disasters which takes into account the uncertainty of parameters and models to create disaster management alternatives in populated areas. By way example, disaster management alternatives can include plans for evacuating populations, dealing with the impact of a hurricane/disaster. Such plans can be defined by governing entities based on the estimated impacts.

FIG. 1 is a diagram illustrating determinist modeling and stochastic modeling, according to an embodiment of the present invention. By way of illustration, FIG. 1 depicts parameter data and model input such as a weather forecast 102 and a flooding and mudslide model 104 that are used to make estimations 106 on population/spatial distribution and historical and static risk maps, and ultimately, to create a disaster management plan 108. Additionally, FIG. 1 depicts an ensemble 110 of models and parameter data to make estimations 112 on population/spatial distribution and historical and static risk maps, and to further create alternative disaster management plans 114 given certain uncertainties.

In an aspect of the invention, an ensemble of models taking several realizations of equally probable atmospheric parameters can be used, for example, to forecast the distribution of possible precipitation (rain) over the risk areas previously defined based on static parameters (for example, topography, soil type, vegetation, land use, and/or population occupation). An ensemble of flooding and mudslides models as well as the rain distribution previously estimated using several realizations of equally probable soil parameters are used to estimate the spatial distribution of floods and mudslides. The distributions and/or data vary in the space and time, facilitating such an estimation.

In general, there can be error in both input parameters and in models due to possible simplifications. Accordingly, rather than using a single determinist value for a given parameter, an aspect of the invention includes using several probable inputs based on its distribution (considering error, etc.) and/or multiple models (considering distinct possible physics). This creates hundreds of scenarios (an ensemble of scenarios) and all of the resulting outputs of the scenarios provide a distribution that can be used to assess the probability or risk of a disaster occurring.

If natural disasters are expected in populated areas, risk are assessed based on the spatio-temporal probabilistic distribution provided by the models of weather, floods, and mudslides. In accordance with at least one embodiment of the invention, alternative disaster management strategies can be defined for risk areas in advance. These strategies can be updated as time progresses and as new temporal data is collected and models are reassessed.

Accordingly, in contrast to disadvantageous existing approaches, an aspect of the invention includes implementing a stochastic modeling approach to take into account models and parameter variability. For example, at least one embodiment of the invention includes using combined stochastic dynamical modeling (weather, flood, mudslide, etc.) with static demographic data (population distribution, etc.), and can extend the implementation to other/multiple natural disasters. The demographics (geographic information system-(GIS-) based) can allow an estimation of the impact of a (potential) disaster on people and properties by overlapping the estimation on maps, allowing the actions to be prioritized in areas with higher risks/impacts.

Parameter input data can be obtained and/or derived from several national and international agencies such as the National Oceanic and Atmospheric Administration (NOAA) (global weather models), National Aeronautics and Space Administration (NASA) (satellite data), weather stations (private and public; for example, Instituto Nacional de Meteorologia (INMET) in Brazil, WeatherBug), etc. Also, input models can include open community models (for example, Weather Research and Forecasting (WRF) model, mesoscale models such as MM5, Brazilian developments on the Regional Atmospheric Modeling System (BRAMS), etc.) and developed analytical models developed (for example, analytic models for flooding, mudslides, etc.).

The parameter input data and input models can be used to forecast a natural disaster, for example, by the following progression: estimate an amount of rain (weather model) →estimate an amount of flooding (flooding model) and its probability→estimate the conditions to trigger a landslide and its probability. The conditions for triggering a natural disaster can come from a combination of static parameters (for example, topography slope, soil type, vegetation, and land use) and dynamical parameters such as rain quantity/intensity and the initial conditions of the land (for example, soil moisture saturation).

An aspect of the invention includes generating and providing key performance indicators (KPIs) and analytical tools for assessing risk for each disaster management alternative. Human users can then take this input to select the best (or otherwise desired or preferred) actions to take.

FIG. 2 is a block diagram illustrating an example embodiment, according to an aspect of the invention. By way of illustration, FIG. 2 depicts a data collection and provisioning system 202, a weather prediction core system 210 and a visualization and alert layer 220. The data collection and provisioning system 202 includes a collection of static parameters 204 from maps and GIS data, which can include population distribution, topography, major landmarks, land use, vegetation, streets, rivers, soil type, etc. The data collection and provisioning system 202 also includes a collection of dynamic parameters 206 from meteorology data, which can include sources such as NOAA, NASA, INMET, Brazilian's Centro de Previsão de Tempo e Estudos Climáticos (CPTEC), weather stations, etc. The static and dynamic parameters are provided to a calibration component 208, which includes a database with historical data.

The data collection and provisioning system 202 provides data to the weather prediction core system 210, which includes pre-processing modeling input formats 212 (for example, Network Common Data Form (NetCDF) and Hierarchical Data Format (HDF)). Additionally within the weather prediction core system 210 are provided a prediction model engine 214 for a country, which can include a WRF model, a mesoscale model such as MM5, BRAMS, others, etc. Input is also provided to the prediction model 216 for areas of interest (within the country), which can include similar models/components. Further, within the weather prediction core system 210, prediction data formats 218 are output. These can include, for example, Keyhole Markup Language (KML), Comma Separated Values (CSV), GRIdded Binary (GriB), NetCDF, etc.

The weather prediction core system 210 provides data to the visualization and alert layer 220, which includes a main analytics models component 222 (including, for example, considerations for weather, flood, landslide, fire, air quality, etc.). The main analytics models component 222 provides data to a model results module 224, which can include capabilities for a website, KML, text files, alerts, dashboards, graphics, etc. Also, as detailed herein in connection with an example embodiment of the invention, an ensemble requires multiple instances of a FIG. 2 output.

FIG. 3 is a flow diagram illustrating techniques for estimating risk of impact of a natural disaster on a populated area, according to an embodiment of the present invention. Step 302 includes using a collection of dynamic natural disaster modeling information to estimate a spatio-temporal distribution of a parameter of a potential natural disaster. This step can be carried out, for example, using an analytical models module. Additionally, in this step the dynamic natural disaster modeling information is input to an instance of a weather forecast model (which can use it as initial and/or boundary conditions) which computes simulation results for multiple natural disaster parameters (for example, the expected precipitation quantity, rate, temperature, wind speed, and humidity) for an area at a given time interval. Further, in this step, the simulation results produced on each time step within the given time interval are included as the estimate of the spatio-temporal distribution of a parameter of the potential natural disaster (which may use some or all of the simulation results).

The collection of dynamic natural disaster modeling information can include an ensemble of models taking multiple realizations of at least one probable atmospheric parameter. Additionally, the collection of dynamic natural disaster modeling information includes data that varies in location and time. Further, the collection of dynamic natural disaster modeling information can be obtained from at least one of a government agency, a global weather model, satellite data, a weather station, a regional weather model and a developed analytical model.

Step 304 includes using a collection of static demographic data to estimate risk of impact of the parameter of the potential natural disaster on a populated area based on the estimated spatio-temporal distribution of the parameter. This step can be carried out, for example, using historical data describing past impacts on a similar populated area. Also, in this step, the static demographic data is overlayed with the estimated spatio-temporal distribution via applying a weight to each of at least one populated area based on at least one historical natural disaster incidents and related impact for each area. This data is used to calibrate the models for the quantification of the risk estimation.

The collection of static demographic data can include, for example, at least one of topography, soil type, vegetation, land use, water bodies, drainage networks, and population occupation.

Using a collection of static demographic data to estimate risk of impact of the parameter of the potential natural disaster on a populated area based on the estimated spatio-temporal distribution of the parameter can include overlapping the collection of static demographic data and the estimated spatio-temporal distribution of the parameter to generate multiple outputs on a map to assess a probability of the parameter of the potential natural disaster occurring at the populated area. Additionally, overlapping the collection of static demographic data and the estimated spatio-temporal distribution of the parameter to generate multiple outputs on a map to assess a probability of the parameter of the potential natural disaster occurring at the populated area can include facilitating prioritization of an area with a higher probability of occurrence. Further, as described herein, the overlaying process is characterized by applying weights to each set of populated areas based on historical weather incidents within them, where the potential of a natural disaster is quantified based on the results produced from that process.

The techniques depicted in FIG. 3 can additionally include using the estimated risk of impact of the parameter of the potential natural disaster on a populated area to generate a natural disaster management strategy for the populated area. This step can be carried out, for example, using an ensemble of scenarios of main analytical models. The decision of utilizing the estimated risk to generate a management strategy can be a decision left up, for example, to the human/governing body in charge.

Generating a natural disaster management strategy for the populated area can include generating multiple disaster management alternatives (plans for evacuating populations, dealing with the impact of a hurricane/disaster, etc.). Additionally, an aspect of the invention can include generating at least one key performance indicator (KPI) for assessing risk for each disaster management alternative. The types of information represented by these KPIs can include probability of flooding, for example, the potential side effects on transportation and mobility, the likelihood of erosion, flood, human isolation, loss of property due to landslides, etc. Further, at least one embodiment of the invention can also include facilitating a user to select a desired disaster management alternative based on the at least one key performance indicator.

The techniques depicted in FIG. 3 can additionally include updating the natural disaster management strategy as new temporal data is collected.

The techniques depicted in FIG. 3 can also, as described herein, include providing a system, wherein the system includes distinct software modules, each of the distinct software modules being embodied on a tangible computer-readable recordable storage medium. All the modules (or any subset thereof) can be on the same medium, or each can be on a different medium, for example. The modules can include any or all of the components and/or modules shown in the figures and described herein. In an aspect of the invention, the modules can run, for example on a hardware processor. The method steps can then be carried out using the distinct software modules of the system, as described above, executing on a hardware processor. Further, a computer program product can include a tangible computer-readable recordable storage medium with code adapted to be executed to carry out at least one method step described herein, including the provision of the system with the distinct software modules.

Additionally, the techniques depicted in FIG. 3 can be implemented via a computer program product that can include computer useable program code (or data) that is stored in a computer readable storage medium in a data processing system, and wherein the computer useable program code (or data) was downloaded over a network from a remote data processing system. Also, in an aspect of the invention, the computer program product can include computer useable program code (or data) that is stored in a computer readable storage medium in a server data processing system, and wherein the computer useable program code (or data) are downloaded over a network to a remote data processing system for use in a computer readable storage medium with the remote system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in a computer readable medium having computer readable program code embodied thereon.

An aspect of the invention or elements thereof can be implemented in the form of an apparatus including a memory and at least one processor that is coupled to the memory and operative to perform exemplary method steps.

Additionally, an aspect of the present invention can make use of software running on a general purpose computer or workstation. With reference to FIG. 4, such an implementation might employ, for example, a processor 402, a memory 404, and an input/output interface formed, for example, by a display 406 and a keyboard 408. The term "processor" as used herein is intended to include any processing device, such as, for example, one that includes at least one CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, a mechanism for inputting data to the processing unit (for example, mouse), and a mechanism for providing results associated with the processing unit (for example, printer). The processor 402, memory 404, and input/output interface such as display 406 and keyboard 408 can be interconnected, for example, via bus 410 as part of a data processing unit 412. Suitable interconnections, for example via bus 410, can also be provided to a network interface 414, such as a network card, which can be provided to interface with a computer network, and to a media interface 416, such as a diskette or CD-ROM drive, which can be provided to interface with media 418.

Accordingly, computer software including instructions or code for performing the methodologies of the invention, as described herein, may be stored in an associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 402 coupled directly or indirectly to memory elements 404 through a system bus 410. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 408, displays 406, pointing devices, and the like)

can be coupled to the system either directly (such as via bus 410) or through intervening I/O controllers (omitted for clarity).

Network adapters such as network interface 414 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 412 as shown in FIG. 4) running a server program. It will be understood that such a physical server may or may not include a display and keyboard.

As noted, aspects of the present invention may take the form of a computer program product embodied in a computer readable medium having computer readable program code embodied thereon. Also, any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, Do apparatus, or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of at least one programming language, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, an aspect of the invention includes an article of manufacture tangibly embodying computer readable instructions which, when implemented, cause a computer to carry out a plurality of method steps as described herein.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the components shown in FIG. 2. The method steps can then be carried out using the distinct software modules and/or sub-modules of the system, as described above, executing on a hardware processor 402. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, an appropriately programmed general purpose digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of another feature, integer, step, operation, element, component, and/or group thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

At least one aspect of the present invention may provide a beneficial effect such as, for example, implementing a stochastic modeling approach to take into account models and parameter variability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for estimating risk of impact of a natural disaster on a populated area, wherein the method comprises:
   estimating a spatio-temporal distribution of a parameter of a potential natural disaster based on a collection of dynamic natural disaster modeling information, wherein the collection of dynamic natural disaster modeling information comprises at least information derived from a global weather model and satellite data comprising at least rain quantity and soil moisture saturation for multiple populated areas, and wherein said estimating the spatio-temporal distribution comprises:
      inputting the dynamic natural disaster modeling information to an instance of a weather forecast model to compute simulation results for multiple natural disaster parameters for an area at a given time interval; and
      incorporating the simulation results produced on each time step within the given time interval into the estimate of the spatio-temporal distribution of a parameter of the potential natural disaster;
   estimating risk of impact of the parameter of the potential natural disaster on the multiple populated areas based on (i) the estimated spatio-temporal distribution of the parameter and (ii) a collection of static demographic data comprising information pertaining at least to topography slope, soil type, vegetation, water bodies, land use, drainage networks, and population occupation for the multiple populated areas, wherein said estimating the risk of impact comprises:
      overlaying the static demographic data with the estimated spatio-temporal distribution; and
      applying a weight to each of the multiple populated areas based on (i) historical natural disaster incidents for each of the multiple populated areas and (ii) impact corresponding to said historical natural disaster incidents for each of the multiple populated areas;
   using the estimated risk of impact of the parameter of the potential natural disaster on the multiple populated areas to generate multiple natural disaster management strategies for the multiple populated areas; and
   generating at least one key performance indicator for assessing risk for each of the multiple natural disaster management strategies.

2. The method of claim 1, further comprising facilitating a user to select a desired one of the multiple disaster management strategies based on the at least one key performance indicator.

3. The method of claim 1, further comprising updating each of the multiple natural disaster management strategies as new temporal data is collected.

4. The method of claim 1, wherein the collection of dynamic natural disaster modeling information comprises an ensemble of models taking multiple realizations of at least one probable atmospheric parameter.

5. The method of claim 1, wherein the collection of dynamic natural disaster modeling information comprises data that varies in location and time.

6. The method of claim 1, wherein using the collection of static demographic data to estimate risk of impact of the parameter of the potential natural disaster on the multiple populated areas based on the estimated spatio-temporal distribution of the parameter comprises overlapping the collection of static demographic data and the estimated spatio-temporal distribution of the parameter to generate multiple outputs on a map to assess a probability of the parameter of the potential natural disaster occurring at the multiple populated areas.

7. The method of claim 6, wherein overlapping the collection of static demographic data and the estimated spatio-temporal distribution of the parameter to generate multiple outputs on a map to assess a probability of the parameter of the potential natural disaster occurring at the multiple populated areas comprises facilitating prioritization of an area with a higher probability of occurrence.

8. The method of claim 1, wherein the collection of dynamic natural disaster modeling information further comprises at least information derived from a government agency, a weather station and a developed analytical model.

9. The method of claim 1, further comprising:
providing a system, wherein the system comprises at least one distinct software module, each distinct software module being embodied on a tangible computer-readable recordable storage medium, and wherein the at least one distinct software module comprises a prediction engine model module and an analytical model module executing on a hardware processor.

10. An article of manufacture comprising a non-transitory computer readable storage medium having computer readable instructions tangibly embodied thereon which, when implemented, cause a computer to carry out a plurality of method steps comprising:
estimating a spatio-temporal distribution of a parameter of a potential natural disaster based on a collection of dynamic natural disaster modeling information, wherein the collection of dynamic natural disaster modeling information comprises at least information derived from a global weather model and satellite data, and wherein said estimating the spatio-temporal distribution comprises:
inputting the dynamic natural disaster modeling information to an instance of a weather forecast model to compute simulation results for multiple natural disaster parameters for an area at a given time interval; and
incorporating the simulation results produced on each time step within the given time interval into the estimate of the spatio-temporal distribution of a parameter of the potential natural disaster;
estimating risk of impact of the parameter of the potential natural disaster on multiple populated areas based on (i) the estimated spatio-temporal distribution of the parameter and (ii) a collection of static demographic data comprising information pertaining at least to topography, water bodies, and population occupation, wherein said estimating the risk of impact comprises:
overlaying the static demographic data with the estimated spatio-temporal distribution; and
applying a weight to each of the multiple populated areas based on (i) historical natural disaster incidents for each of the multiple populated areas and (ii) impact corresponding to said historical natural disaster incidents for each of the multiple populated areas;
using the estimated risk of impact of the parameter of the potential natural disaster on the multiple populated areas to generate multiple natural disaster management strategies for the multiple populated areas; and
generating at least one key performance indicator for assessing risk for each of the multiple natural disaster management strategies.

11. The article of manufacture of claim 10, wherein the computer readable instructions which, when implemented, further cause a computer to carry out a method step comprising updating each of the multiple natural disaster management strategies as new temporal data is collected.

12. The article of manufacture of claim 10, wherein using the collection of static demographic data to estimate risk of impact of the parameter of the potential natural disaster on the multiple populated areas based on the estimated spatio-temporal distribution of the parameter comprises overlapping the collection of static demographic data and the estimated spatio-temporal distribution of the parameter to generate multiple outputs on a map to assess a probability of the parameter of the potential natural disaster occurring at the multiple populated areas.

13. The article of manufacture of claim 12, wherein overlapping the collection of static demographic data and the estimated spatio-temporal distribution of the parameter to generate multiple outputs on a map to assess a probability of the parameter of the potential natural disaster occurring at the multiple populated areas comprises facilitating prioritization of an area with a higher probability of occurrence.

14. A system for estimating risk of impact of a natural disaster on a populated area, comprising:
a memory; and
at least one processor coupled to the memory and operative for:
estimating a spatio-temporal distribution of a parameter of a potential natural disaster based on a collection of dynamic natural disaster modeling information, wherein the collection of dynamic natural disaster modeling information comprises at least information derived from a global weather model and satellite data, and wherein said estimating the spatio-temporal distribution comprises:
inputting the dynamic natural disaster modeling information to an instance of a weather forecast model to compute simulation results for multiple natural disaster parameters for an area at a given time interval; and
incorporating the simulation results produced on each time step within the given time interval into the estimate of the spatio-temporal distribution of a parameter of the potential natural disaster;
estimating risk of impact of the parameter of the potential natural disaster on multiple populated areas based on (i) the estimated spatio-temporal distribution of the parameter and (ii) a collection of static demographic data comprising information pertaining at least to topography, water bodies, and population occupation, wherein said estimating the risk of impact comprises:
overlaying the static demographic data with the estimated spatio-temporal distribution; and
applying a weight to each of the multiple populated areas based on (i) historical natural disaster incidents for each of the multiple populated areas and (ii) impact corresponding to said historical natural disaster incidents for each of the multiple populated areas;
using the estimated risk of impact of the parameter of the potential natural disaster on the multiple populated areas to generate multiple natural disaster management strategies for the multiple populated areas; and
generating at least one key performance indicator for assessing risk for each of the multiple natural disaster management strategies.

15. The system of claim 14, wherein the at least one processor coupled to the memory is further operative for updating each of the multiple natural disaster management strategies as new temporal data is collected.

16. The system of claim 14, wherein the at least one processor coupled to the memory operative for using the collection of static demographic data to estimate risk of impact of the parameter of the potential natural disaster on the multiple populated areas based on the estimated spatio-temporal distribution of the parameter is further operative for overlapping the collection of static demographic data and the estimated spatio-temporal distribution of the parameter to generate multiple outputs on a map to assess a probability of the parameter of the potential natural disaster occurring at the multiple populated areas.

17. The system of claim 16, wherein the at least one processor coupled to the memory operative for overlapping the collection of static demographic data and the estimated spatio-temporal distribution of the parameter to generate multiple outputs on a map to assess a probability of the parameter of the potential natural disaster occurring at the multiple populated areas is further operative for facilitating prioritization of an area with a higher probability of occurrence.

\* \* \* \* \*